(12) United States Patent
Bhowmik et al.

(10) Patent No.: US 7,548,104 B2
(45) Date of Patent: Jun. 16, 2009

(54) DELAY LINE WITH DELAY CELLS HAVING IMPROVED GAIN AND IN BUILT DUTY CYCLE CONTROL AND METHOD THEREOF

(75) Inventors: Prasenjit Bhowmik, Agartala (IN); Sundararajan Krishnan, Bangalore (IN); G. Sriram, Bangalore (IN)

(73) Assignee: Cosmic Circuits Private Limited, Bangalore (IN)

( * ) Notice: Subject to any disclaimer, the term of this patent is extended or adjusted under 35 U.S.C. 154(b) by 0 days.

(21) Appl. No.: 11/760,784

(22) Filed: Jun. 10, 2007

(65) Prior Publication Data
US 2007/0285144 A1 Dec. 13, 2007

(30) Foreign Application Priority Data
Jun. 9, 2006 (IN) .................. 1007/CHE/2006
Jun. 8, 2007 (IN) .................. 1181/CHE/2007

(51) Int. Cl.
H03H 11/26 (2006.01)
(52) U.S. Cl. .................. 327/261; 327/263; 327/264; 327/285
(58) Field of Classification Search .................. None
See application file for complete search history.

(56) References Cited

U.S. PATENT DOCUMENTS

| 5,057,722 | A | * | 10/1991 | Kobatake .................. 327/288 |
| 5,179,303 | A | * | 1/1993 | Searles et al. .................. 327/277 |
| 5,220,326 | A | | 6/1993 | Ledzius et al. |
| 5,387,914 | A | | 2/1995 | Mangelsdorf |
| 5,714,899 | A | * | 2/1998 | Wuidart et al. .................. 327/262 |
| 6,535,157 | B1 | | 3/2003 | Garrity et al. |
| 6,661,214 | B1 | | 12/2003 | Hann et al. |
| 6,825,790 | B2 | | 11/2004 | Chou |
| 6,891,493 | B2 | | 5/2005 | Whittaker et al. |
| 6,963,300 | B1 | | 11/2005 | Lee |
| 7,158,443 | B2 | | 1/2007 | Lin |
| 7,248,199 | B2 | | 7/2007 | Asano et al. |
| 7,253,686 | B2 | | 8/2007 | Ali |
| 7,285,996 | B2 | | 10/2007 | Fiedler |
| 2005/0212575 | A1 | | 9/2005 | Kim |
| 2007/0030753 | A1 | | 2/2007 | Kwak |
| 2007/0046345 | A1 | | 3/2007 | Tai et al. |
| 2007/0182474 | A1 | * | 8/2007 | Von Thun .................. 327/276 |
| 2008/0054963 | A1 | | 3/2008 | Masenas |

FOREIGN PATENT DOCUMENTS

WO   WO 99/63414   12/1999

* cited by examiner

*Primary Examiner*—An T Luu
(74) *Attorney, Agent, or Firm*—Kanika Radhakrishnan; Evergreen Valley Law Group P.C.

(57) ABSTRACT

A delay line including a sequence of identical delay cells with improved gain and in built duty cycle distortion control and a method thereof is disclosed. Each delay cell of the sequence includes a current source, four transistors, and a load capacitor. A gate of the current source receives a voltage bias that controls a delay of the delay cell. A drain of the first transistor is connected to the drain of the current source. The first and second transistor gates receive an input clock signal. The second transistor drain is connected to the source of the current source. The third transistor gate and the load capacitor are also connected to the drain of the current source. The fourth transistor drain is connected to the third transistor drain. The fourth transistor gate is coupled to an output of a second consecutive delay cell for duty cycle distortion control.

15 Claims, 4 Drawing Sheets

DELAY LINE WITH DELAY CELLS HAVING IMPROVED GAIN AND IN BUILT DUTY CYCLE CONTROL AND METHOD THEREOF

CROSS-REFERENCE TO RELATED APPLICATIONS

This application claims priority to Indian Provisional Patent Application No. 1007/CHE/2006, filed Jun. 9, 2006, and Indian Non-Provisional Patent Application No. 1181/CHE/2007, filed Jun. 8, 2007, which are incorporated herein by reference.

BACKGROUND

1. Technical Field

Embodiments of the invention relate generally to delay lines and more particularly to delay cells with improved gain and reduced duty cycle distortion for a wide range of delays.

2. Prior Art

A delay line includes several delay cells connected in series that generate a required delay. Delay lines constitute several electronic devices, for example Delay Locked Loops (DLLs), which have a wide variety of electronic applications such as clock and data recovery, frequency synthesis, and generation of clock pulses for sampling in high speed Analog-to-Digital Converters (ADCs). A delay cell constitutes a building block of the delay line. The number of delay cells that the delay line makes use of depends on the required delay. It is therefore desirable that the delay cell supports a wide range of delays.

In order to sufficiently support the wide variety of applications, the delay line needs to have a wide range of operating frequencies. However, operating the delay line at high frequencies usually results in a loss of 'gain' and 'duty cycle distortion' in an output of a current or voltage controlled delay cell. The term gain refers to a variation in a delay of the delay cell with respect to a control voltage that controls a current through the delay cell. Duty cycle distortion may occur because of mismatch between rising and falling edge delays of the delay cell.

Some existing delay cells provide a reasonable gain over a limited delay range. In the application of this delay line in a DLL, the frequency range of operation of the DLL gets limited. Further, delay lines with large number of delay cells have considerable duty cycle distortion, thereby limiting the maximum number of delay cells that can be connected in series. To reduce the duty cycle distortion, a duty cycle control loop is used for which additional circuitry is required. This enhances chip area and power dissipation.

Existing delay lines that have the wide range of delay control make use of a current-starved inverter in the delay cell. A current starved inverter includes a NMOS and a PMOS current source. The delay of the delay cell is controlled by providing different voltage bias signals to control the current through the NMOS and PMOS current sources. However, the delay cell suffers from poor gain due to charge sharing between a load capacitance at an output of the delay cell and junction capacitances of the delay cell. One technique to reduce the charge sharing is to make the load capacitance value sufficiently greater than the drain junction capacitances. However, this results in an increase in minimum delay, switching power consumption, and die area.

Further in delay lines using current starved inverters, duty cycle distortion occurs due to mismatch between NMOS and PMOS current sources or non-symmetrical inverter trip point. As a result of this mismatch, pulse width of an output clock at the end of the delay line that uses N delay cells can expand or shrink by '$N(T_{dr}-T_{df})$', where $T_{dr}$ is the rising edge delay and $T_{df}$ is the falling edge delay. In case this value becomes greater than half the time period of an input clock to the delay line, no clock output will be obtained at end of the delay line.

SUMMARY

Embodiments of the invention described herein provide a delay line with identical delay cells that have improved gain and reduced duty cycle distortion for a wide range of delays, In accordance with an embodiment of the invention a delay cell is provided. The delay cell includes a current source, a first transistor, a second transistor, a third transistor, a fourth transistor, and a load capacitor. The current source includes a drain, a gate and a source. The gate of the current source receives a voltage bias signal. Each of the first, second, third, and fourth transistors include a drain, a gate, and a source. The drain of the first transistor is electrically connected to the drain of the current source, the gate of the first transistor receives an input clock signal that drives the delay cell, and the source of the first transistor is electrically connected to a power supply terminal. The drain of the second transistor is electrically connected to the source of the current source, the gate of the second transistor receives the input clock signal, and the source of the second transistor is electrically connected to a ground terminal. The gate of the third transistor is electrically connected to the drain of the current source, and the source of the third transistor is electrically connected to the power supply terminal. The drain of the fourth transistor is electrically connected to the drain of the third transistor, the gate of the fourth transistor is coupled to an output of an another delay cell, and the source of the fourth transistor is electrically connected to the ground terminal. The load capacitor has a first terminal and a second terminal. The first terminal is electrically connected to the drain of the current source, and the second terminal is electrically connected to the ground terminal.

In accordance with another embodiment of the invention, duty cycle is controlled by controlling one of the edges (controlled edge) depending on the bias voltage and generating an other non-controlled edge from the controlled edge with a delay equal to the delay value of two identical delay stages. This makes the duty cycle at the output of each delay cell constant and independent of the input duty cycle. This prevents the output from disappearing when a huge number of delay cells are connected in series. A 50% duty cycle can be ensured by generating the other non-controlled edge from the controlled edge delayed by appropriate number of delay stages.

In accordance with another embodiment of the invention, a delay line is provided. The delay line includes a sequence of identical delay cells. A first delay cell of the sequence is driven by a reference clock signal, and each successive delay cell of the sequence is driven by an output from a preceding delay cell. Each delay cell of the sequence includes a current source, a first transistor, a second transistor, a third transistor, a fourth transistor, and a load capacitor. The current source includes a drain, a gate and a source. The gate of the current source receives a voltage bias signal. Each of the first, second, third, and fourth transistors include a drain, a gate, and a source. The drain of the first transistor is electrically connected to the drain of the current source, the gate of the first transistor receives an input clock signal that drives the delay cell, and the source of the first transistor is electrically connected to a power supply terminal. The drain of the second transistor is electrically connected to the source of the current source, the gate of the second transistor receives the input clock signal, and the source of the second transistor is electrically connected to a ground terminal. The gate of the third transistor is electrically connected to the drain of the current source, and the source of the third transistor is electrically connected to the power supply terminal. The drain of the fourth transistor is electrically connected to the drain of the third transistor, the gate of the fourth transistor is coupled to an output of a second consecutive delay cell, and the source of the fourth transistor is electrically connected to the ground terminal. The load capacitor has a first terminal and a second terminal. The first terminal is electrically connected to the drain of the current source, and the second terminal is electrically connected to the ground terminal.

In accordance with another embodiment of the invention, a method for maintaining a gain and a duty cycle of a delay cell is provided. The delay cell includes a first transistor, a second transistor, a third transistor, a fourth transistor, and a load capacitor. The method includes providing a discharge path for a charge stored in the load capacitor, and providing a pull down path to a first intermediate output of the delay cell based on receiving a pulse of an output of a second consecutive identical delay cell to the delay cell at a gate of the fourth transistor. In case of a known delay like in a DLL, the duty cycle can be controlled to 50% by connecting the output from an appropriate delay cell at a gate of the fourth transistor. The discharge path is provided by inserting a current source between a drain of the first transistor and the drain of the second transistor. The load capacitor discharges to ground through the current source and the second transistor. A source of the current source is electrically connected to the drain of the second transistor. The first intermediate output is received at a junction between the drain of the third transistor and the drain of the fourth transistor. The first intermediate output is received based on receiving the charge stored in the load capacitor at a gate of the third transistor.

This summary is not intended to describe each embodiment of the invention. The Detailed description and Figures that follow provide additional aspects of embodiments of the invention.

DETAILED DESCRIPTION OF THE EMBODIMENTS

Embodiments of the invention provide a delay line with increased gain controllability, and reduced duty cycle distortion.

Figure 1:
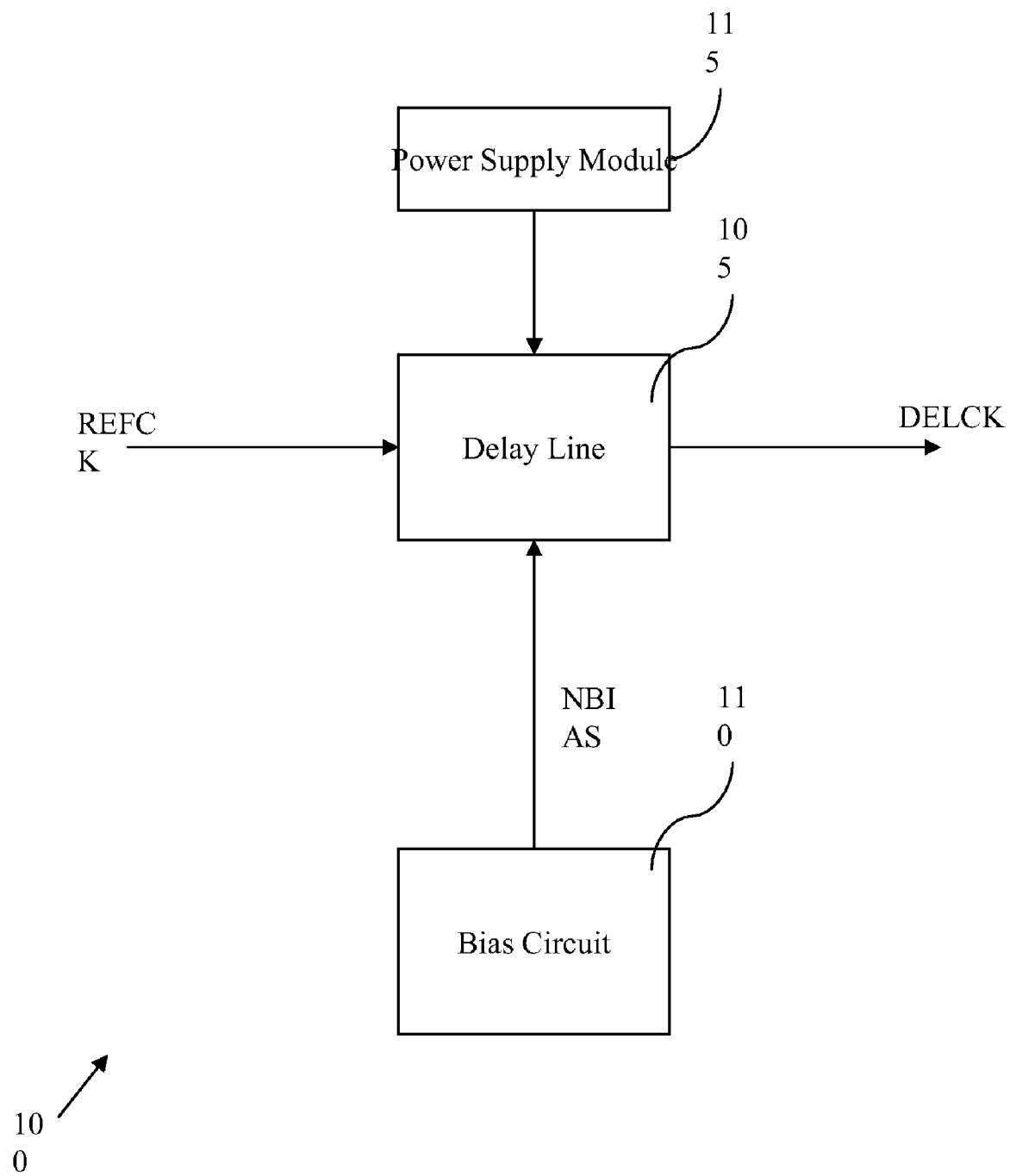
FIG. 1 is a block diagram illustrating an example environment in which embodiments of the invention may be practiced.

FIG. 1 is a block diagram illustrating an example environment 100, in which embodiments of the invention may be practiced. The environment 100 includes a delay line 105, a bias circuit 110, and a power supply module 115. The delay line 105 receives a reference clock signal 'REFCK' at its input. The bias circuit 110 is coupled to the delay line 105 and provides a voltage bias signal 'NBIAS' to the delay line 105. The NBIAS controls a delay of the delay line 105. The power supply module 115, for example, a Low Drop Out (LDO) regulator provides a supply voltage to the delay line 105.

The delay line 105 includes a sequence of identical delay cells that generate the delay. A delay cell has been explained in details in conjunction with FIG. 2.

Figure 2:
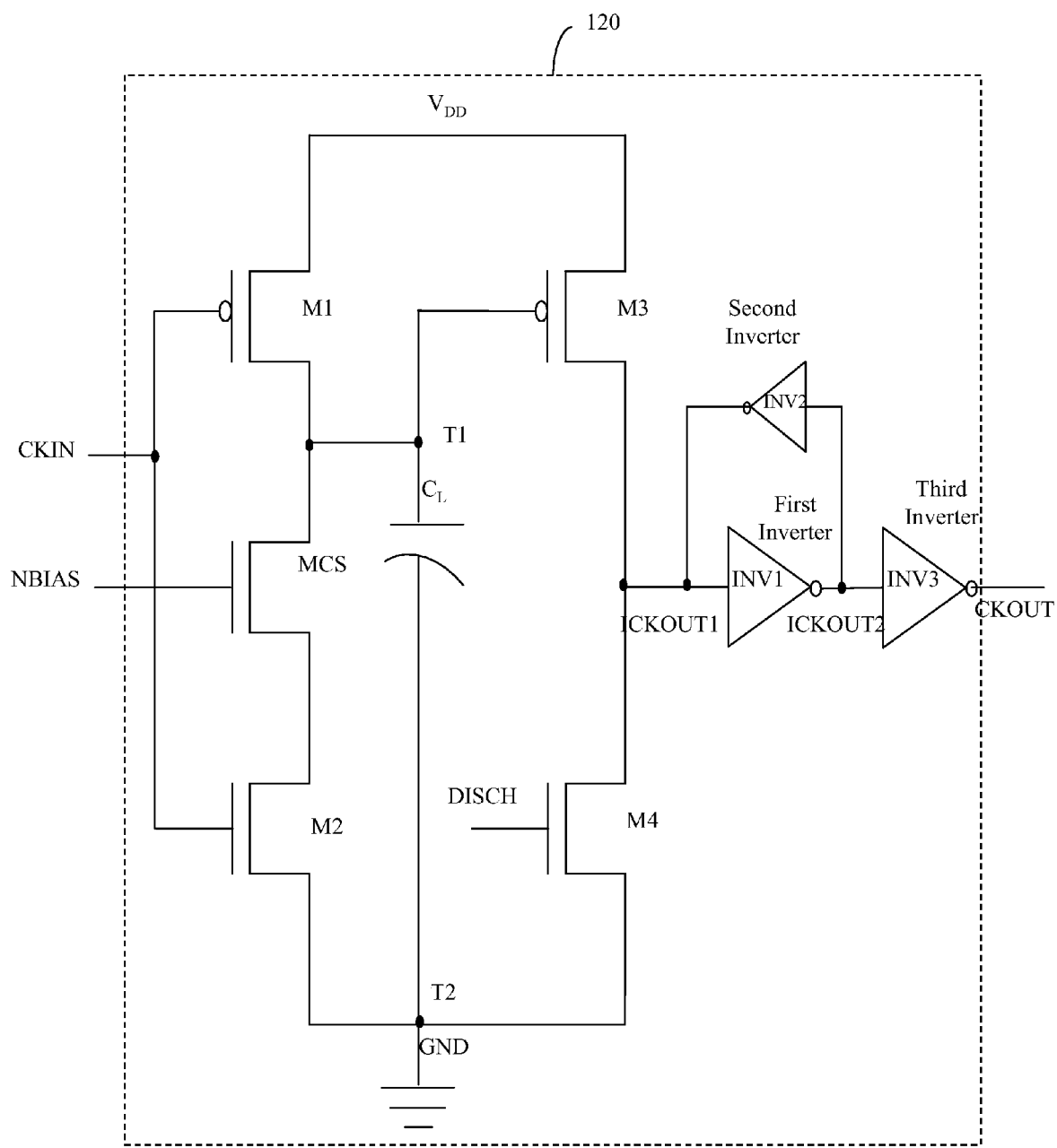
FIG. 2 is a schematic circuit diagram illustrating a delay cell in accordance with an embodiment of the invention.

FIG. 2 is a schematic circuit diagram of a delay cell 120 of the delay line 105 in accordance with an embodiment of the invention. The delay cell 120 includes a current source MCS, a first transistor M1, a second transistor M2, a third transistor M3, a fourth transistor M4, and a load capacitor $C_L$. The delay cell 120 further includes a first inverter INV1, a second inverter INV2, and a third inverter INV3. In an embodiment of the invention, the current source MCS is an N-type Metal Oxide Semiconductor (NMOS) current source transistor. The first transistor M1 and the third transistor M3 are P-type Metal Oxide Semiconductor (PMOS) transistors. The second transistor M2 and the fourth transistor M4 are NMOS transistors. The first, second, and third inverters INV1, INV2, and INV3 respectively are Complementary Metal Oxide Semiconductor (CMOS) inverters.

The current source MCS includes a drain, a gate and a source. Each of the first, second, third, and fourth transistors, i.e., M1, M2, M3, and M4 respectively, have a drain, a gate, and a source. The load capacitor $C_L$ has a first terminal T1 and a second terminal T2. The sources of the first transistor M1 and the third transistor M3 are connected to a power supply voltage terminal $V_{DD}$. The sources of the second transistor M2 and the fourth transistor M4, and the second terminal T2 of the load capacitor $C_L$ are connected to a ground terminal GND. Each of the first, second, and third inverters INV1, INV2, and INV3 respectively have an input and an output.

The delay cell 120 receives an input clock signal CKIN. The CKIN is received at the gates of the first transistor M1 and the second transistor M2. The gate of the current source MCS receives the voltage bias signal NBIAS. The drain of the first transistor M1 is connected to the drain of the current source MCS. The drain of the second transistor M2 is connected to the source of the current source MCS. The gate of the third transistor M3 is connected to the drain of the current source MCS. The drain of the fourth transistor M4 is connected to the drain of the third transistor M3. A first intermediate clock signal ICKOUT1 is generated at a junction between the drain of the third transistor M3 and the drain of the fourth transistor M4. The first intermediate clock signal ICKOUT1 is generated in response to the input clock signal CKIN. The first terminal T1 of the load capacitor $C_L$ is connected to the drain of the current source MCS.

The input to the first inverter INV1 is coupled to the junction between the drain of the third transistor M3 and the drain of the fourth transistor M4. A point at which the input to the first inverter INV1 is coupled to the junction between the drain of the third transistor M3 and the drain of the fourth transistor M4 forms a floating node. The input of the second inverter INV2 is connected to the output of the first inverter INV1, and the output of the second inverter INV2 connected to the input of the first inverter INV1. The first inverter INV1 inverts the first intermediate clock signal ICKOUT1 to generate a second intermediate clock signal ICKOUT2. The second inverter INV2 is a 'weak inverter' that maintains or holds the first intermediate clock signal ICKOUT1 when M3 or M4 is not driving.

The pull down path is provided by the fourth transistor M4. For this purpose, the gate of the fourth transistor M4 receives a DISCH input that is an output of a second consecutive delay cell to the delay cell 120. When the DISCH input goes HIGH, M4 turns ON and the first intermediate clock signal ICKOUT1 becomes 'LOW'.

The input of the third inverter INV3 is connected to the output of the first inverter INV1. All connections mentioned in the description are electrical in nature. The third inverter INV3 inverts the second intermediate clock signal ICKOUT2 to generate a delay clock signal CKOUT. The delay clock signal CKOUT so generated is delayed in time with respect to the input clock signal CKIN. The value of the generated delay depends on circuit elements of the delay cell 120.

The bias voltage signal NBIAS has such a value that at a rising edge of the input clock signal CKIN, the current source MCS is ON and in saturation. In other words, the current through the current source MCS is constant. The current source MCS controls a delay of the rising edge of the input clock signal CKIN. At the rising edge of the input clock signal CKIN, the first transistor M1 turns OFF and the second transistor M2 turns ON. The load capacitor $C_L$ then discharges to ground with a controlled current through MCS and M2. The current is controlled by the voltage bias signal NBIAS that is applied at the gate of the current source MCS. Since the drain of the second transistor M2 is coupled to the source of the current source MCS, the load capacitor $C_L$ completely discharges to ground. As a result, the third transistor M3 turns ON correctly. Therefore, there is no loss of gain of the delay cell 120 due to charge sharing compared to existing current-starved delay cells.

Figure 3:
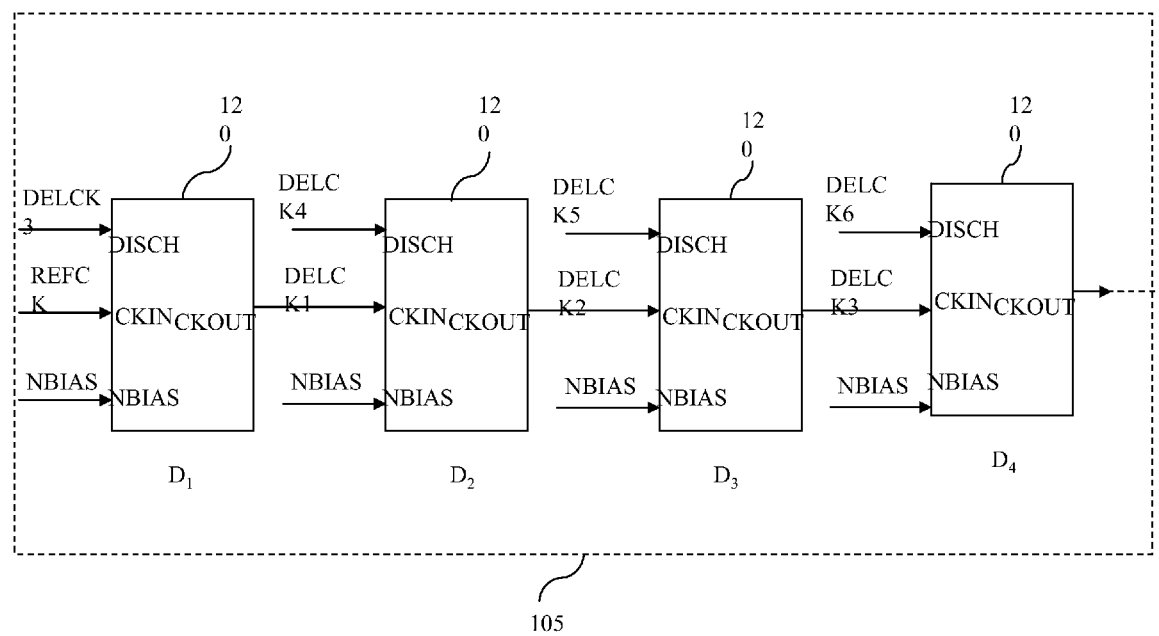
FIG. 3 is a schematic diagram illustrating a delay line in accordance with an embodiment of the invention.

The delay cell 120 as described above receives the inputs CKIN, NBIAS, and DISCH and outputs CKOUT. Referring now to FIG. 3, an implementation of the delay line 105 using the delay cell 120 is shown. FIG. 3 is a schematic diagram of the delay line 105 in accordance with an embodiment of the invention. The delay line 105 includes a sequence of multiple identical delay cells, for example delay cells $\{D_1, D_2, D_3, D_4 \ldots \}$. The delay cells $\{D_1, D_2, D_3, D_4 \ldots \}$ output respective delay clock signals {DELCKs} in response to a reference clock signal REFCLK. For example, the delay cell $D_1$ receives the reference clock signal REFCLK and generates a first delay clock signal DELCK1, which is then input to $D_2$. Similarly, the delay clock signal from each delay cell of the delay line 105 is input to a successive delay cell of the delay line 105, thus generating delay clock signals {DELCK1, DELCK2, DELCK3, DELCLK4, . . . }. The delay clock signals so generated are delayed in time with respect to the reference clock signal REFCK. Further, a particular delay clock signal is delayed in time from a preceding delay clock signal.

The DISCH input of each delay cell of the delay line 105 is coupled to the output of the second consecutive delay cell, i.e., the DISCH input of each delay cell comes from the output of the second delay cell following it. For example, the output DELCK3 of the delay cell $D_3$ is input to the delay cell $D_1$. This makes the pulse width of the DELCK1 a function of the delay produced in the delay cell $D_1$. The pulse width is equal to $2T_{dr}+T_{df}$, where $T_{dr}$ and $T_{df}$ are respectively rising and falling edge delays of the delay cells $\{D_1, D_2, D_3, D_4 \ldots \}$. (this is already explained in the sentences following) In this case, the pulse width corresponds to the rising edge delays of $D_2$ and $D_3$, and the falling edge delay of $D_1$. Since for each delay cell, the pulse width of the corresponding delay clock signal DELCK becomes a constant, there is no distortion of a duty cycle of the delay clock signal DELCK. Hence, the number of delay cells used in the delay line 105 is not limited. In an embodiment of the invention, the duty cycle for a DLL application can be controlled to be 50% by taking the appropriate another delay cell for providing DISCH input.

In accordance with one embodiment of the invention, the delay line 105 as described earlier is used to implement a Delay Locked Loop (DLL).

Figure 4:
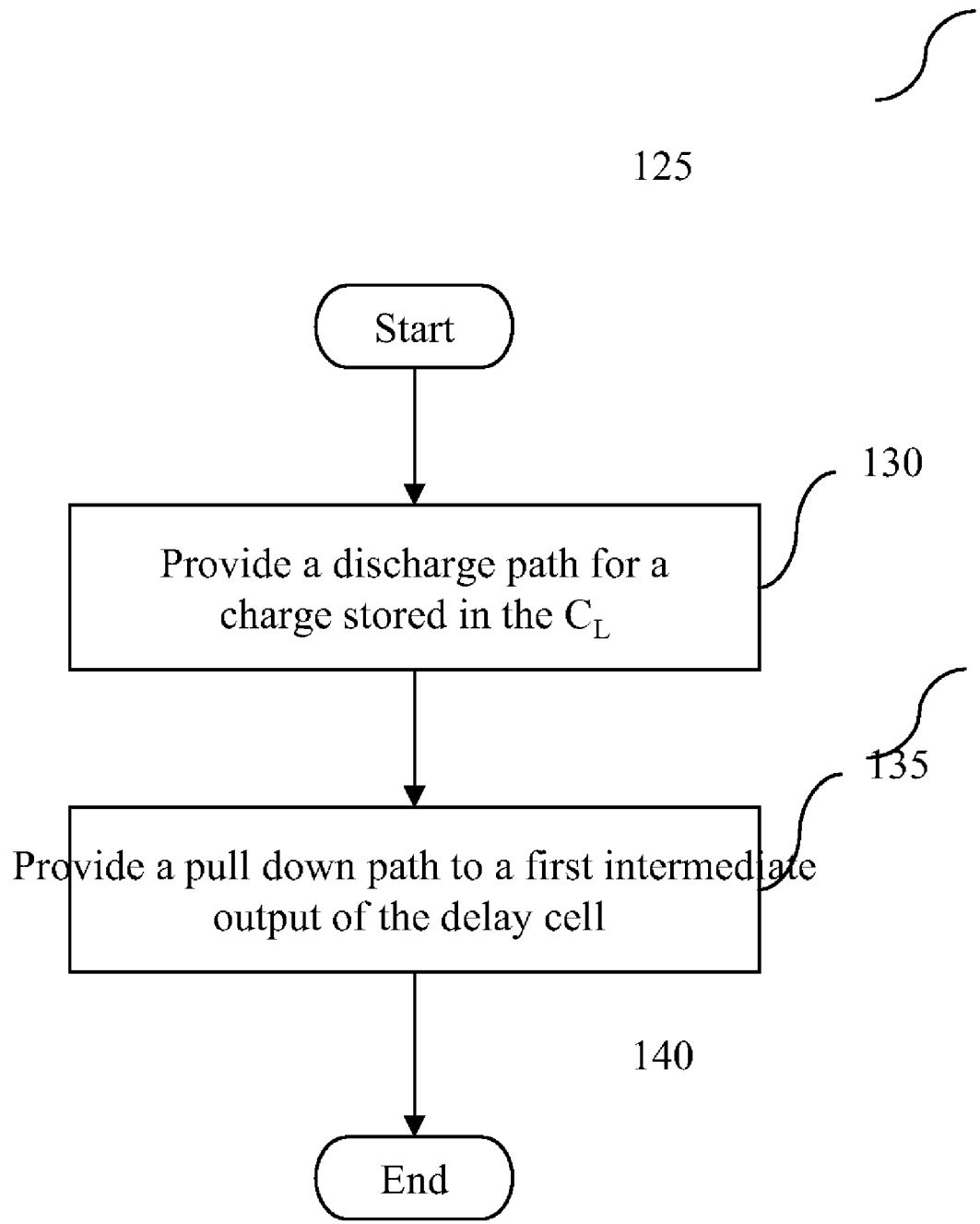
FIG. 4 is a flow chart illustrating a sequence of steps for maintaining a gain and a duty cycle of a delay cell in accordance with an embodiment of the invention.

FIG. 4 is a flow chart illustrating a sequence of steps for maintaining the gain and the duty cycle of the delay cell 120 in accordance with an embodiment of the invention. Step 125 starts. Step 130 provides a discharge path for a charge stored in the $C_L$ with a current which is constant for most of the discharge time. The discharge path is provided by inserting the current source MCS between the drain of the first transistor M1 and the drain of the second transistor M2. The $C_L$ discharges to the ground terminal GND through the current source MCS and the second transistor M2. Step 135 provides the pull down path to an intermediate output, i.e., the first intermediate clock signal ICKOUT1 of the delay cell 120. Step 135 provides the pull down path on receiving a pulse of the output of the second consecutive delay cell to the delay cell 120. The gate of the fourth transistor M4 receives this pulse. Values of the first intermediate clock signal ICKOUT1 depends on the value of the charge stored in the $C_L$. Step 140 ends.

In an embodiment of the invention, a method for connecting the delay cells 120 is implemented to form the delay line 105 shown in FIG. 3.

In another embodiment of the invention, a method for preparing the delay cell 120 is also implemented.

In another embodiment of the invention, a duty cycle is controlled by controlling one of the edges (controlled edge) depending on the bias voltage and generating an other non-controlled edge from the controlled edge with a delay equal to the delay value of two identical delay stages. This makes the duty cycle at the output of each delay cell constant and independent of the input duty cycle. This prevents the output from disappearing when a huge number of delay cells are connected in series. A 50% duty cycle can be ensured by generating the other non-controlled edge from the controlled edge delayed by appropriate number of delay stages.

The method described above includes different steps involved in controlling gain and duty cycle. The method may include a greater or a fewer number of steps than those included in FIG. 4.

The delay cells constituting the delay line 105 as described earlier in accordance with embodiments of the invention support a wide delay range and provide reasonable gains even for small delays. Therefore the delay line 105 can support a wide range of input frequencies, and operates at high frequencies without loss of gain when used in a DLL like application. This is because there is no loss of gain due to charge sharing in the embodied delay cells as in conventional current-starved delay inverters. Also the delay cell makes use of only one (NMOS) current source, which eliminates the need for having matched NMOS and PMOS current sources as in the conventional current-starved delay inverters.

Further by making the pulse width of the output of the delay cell a function of the delay generated by the delay cell, duty cycle distortion is eliminated. Therefore, the embodied delay cells do not require a separate duty cycle control loop for maintaining a tolerable value of the duty cycle distortion in the delay line 105. The delay line 105 can thus include a large number of delay cells without loss of output at the end of the delay line 105.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

The invention claimed is:

1. A delay cell, the delay cell comprising:
   a current source including a drain, a gate and a source, wherein the gate of the current source receives a voltage bias signal;
   a first transistor including a drain, a gate, and a source, wherein the drain of the first transistor is electrically connected to the drain of the current source, the gate of the first transistor receives an input clock signal that drives the delay cell, and the source of the first transistor is electrically connected to a power supply terminal;
   a second transistor including a drain, a gate, and a source, wherein the drain of the second transistor is electrically connected to the source of the current source, the gate of the second transistor receives the input clock signal, and the source of the second transistor is electrically connected to a ground terminal;
   a third transistor including a drain, a gate, and a source, wherein the gate of the third transistor is electrically connected to the drain of the current source, and the source of the third transistor is electrically connected to the power supply terminal;
   a fourth transistor including a drain, a gate, and a source, wherein the drain of the fourth transistor is electrically connected to the drain of the third transistor, the gate of the fourth transistor is coupled to an output of an another delay cell, and the source of the fourth transistor is electrically connected to the ground terminal; and
   a load capacitor having a first terminal and a second terminal, wherein the first terminal is electrically connected to the drain of the current source, and the second terminal is electrically connected to the ground terminal.

2. The delay cell of claim 1, wherein the first and third transistors are P-type Metal Oxide Semiconductor transistors.

3. The delay cell of claim 1, wherein the second and fourth transistors are N-type Metal Oxide Semiconductor transistors.

4. The delay cell of claim 1, wherein the current source is an N-type Metal Oxide Semiconductor current source transistor.

5. The delay cell of claim 1 further comprising: a first inverter including an input and an output, wherein the input of the first inverter is coupled to the drain of the third transistor; a second inverter including an input and an output, wherein the input of the second inverter is coupled to the output of the first inverter, and the output of the second inverter is coupled to the input of the first inverter; and a third inverter including an input and an output, wherein the input of the third inverter is coupled to the output of the first inverter.

6. The delay cell of claim 5, wherein the first inverter receives a first intermediate clock signal at the input of the first inverter, and generates a second intermediate clock signal in response to the first intermediate clock signal.

7. The delay cell of claim 6, wherein the third inverter generates an output clock signal that is delayed in time with respect to the input clock signal in response to the second intermediate clock signal.

8. A delay line including a sequence of delay cells, a first delay cell of the sequence being driven by a reference clock signal, and each successive delay cell of the sequence being driven by an output from a preceding delay cell, wherein each delay cell of the sequence comprises: a current source including a drain, a gate and a source, wherein the gate of the current source receives a voltage bias signal; a first transistor including a drain, a gate, and a source, wherein the drain of the first transistor is electrically connected to the drain of the current source, the gate of the first transistor receives an input clock signal that drives the delay cell, and the source of the first transistor is electrically connected to a power supply terminal; a second transistor including a drain, a gate, and a source, wherein the drain of the second transistor is electrically connected to the source of the current source, the gate of the second transistor receives the input clock signal, and the source of the second transistor is electrically connected to a ground terminal; a third transistor including a drain, a gate, and a source, wherein the gate of the third transistor is electrically connected to the drain of the current source, and the source of the third transistor is electrically connected to the power supply terminal; a fourth transistor including a drain, a gate, and a source, wherein the drain of the fourth transistor is electrically connected to the drain of the third transistor, the gate of the fourth transistor is coupled to an output of a second consecutive delay cell following the delay cell, and the source of the fourth transistor is electrically connected to the ground terminal; and a load capacitor having a first terminal and a second terminal, wherein the first terminal is electrically connected to the drain of the current source, and the second terminal is electrically connected to the ground terminal.

9. The delay line of claim 8, wherein the first and third transistors are P-type Metal Oxide Semiconductor transistors.

10. The delay line of claim 8, wherein the second and fourth transistors are N-type Metal Oxide Semiconductor transistors.

11. The delay line of claim 8, wherein the current source is an N-type Metal Oxide Semiconductor current source transistor.

12. The delay line of claim 8, wherein the delay cell further comprises: a first inverter including an input and an output, wherein the input of the first inverter is coupled to the drain of the third transistor; a second inverter including an input and an output, wherein the input of the second inverter is coupled to the output of the first inverter, and the output of the second inverter is coupled to the input of the first inverter; and a third inverter including an input and an output, wherein the input of the third inverter is coupled to the output of the first inverter.

13. The delay line of claim 12, wherein the first inverter receives a first intermediate clock signal at the input of the first inverter, and generates a second intermediate clock signal in response to the first intermediate clock signal.

14. The delay line of claim 13 wherein the third inverter generates an output clock signal that is delayed in time with respect to the input clock signal in response to the second intermediate clock signal.

15. A method for maintaining a gain and a duty cycle of a delay cell, the delay cell comprising a first transistor, a second transistor, a third transistor, a fourth transistor, and a load capacitor, the method comprising: providing a discharge path for a charge stored in the load capacitor, wherein the discharge path is provided by inserting a current source between a drain of the first transistor and the drain of the second transistor, and wherein the load capacitor discharges to ground through the current source and the second transistor, wherein a source of the current source is electrically connected to the drain of the second transistor; and providing a pull down path to an intermediate output of the delay cell based on receiving a pulse of an output of a second consecutive delay cell to the delay cell at a gate of the fourth transistor, wherein the intermediate output is received at a junction between the drain of the third transistor and the drain of the fourth transistor, wherein receiving the intermediate output is based on receiving the charge stored in the load capacitor at a gate of the third transistor.

* * * * *